United States Patent [19]
Ueda

[11] Patent Number: 6,143,592
[45] Date of Patent: Nov. 7, 2000

[54] MOS SEMICONDUCTOR DEVICE AND METHOD OF FABRICATING THE SAME

[75] Inventor: Takehiro Ueda, Tokyo, Japan

[73] Assignee: NEC Corporation, Tokyo, Japan

[21] Appl. No.: 09/365,017

[22] Filed: Aug. 2, 1999

Related U.S. Application Data

[62] Division of application No. 08/943,416, Sep. 30, 1997.

[30] Foreign Application Priority Data

Sep. 30, 1996 [JP] Japan .................................. 8-278665

[51] Int. Cl.[7] .......................... H01L 21/00; H01L 21/84; H01L 21/8238
[52] U.S. Cl. .......................... 438/197; 438/213; 438/153
[58] Field of Search .................................. 438/213, 153, 438/197, 151, 775

[56] References Cited

U.S. PATENT DOCUMENTS

| | | | |
|---|---|---|---|
| 5,525,550 | 6/1996 | Kato ........................................ | 438/788 |
| 5,554,871 | 9/1996 | Yamashita et al. ..................... | 257/336 |
| 5,793,110 | 8/1998 | Yamaha et al. ......................... | 257/750 |

FOREIGN PATENT DOCUMENTS 3-245563  11/1999  Japan .

OTHER PUBLICATIONS

Katsuyuki Machida, et al., "Improvement of Water–Related Hot–Carrier Reliability by Using ECR Plasma $S1O_2$," *IEEE Transactions on Electron Devices*, vol. 41, pp. 709–714, May 1994.

*Primary Examiner*—Mary Wilczewski
*Assistant Examiner*—James Park
*Attorney, Agent, or Firm*—Foley & Lardner

[57] ABSTRACT

There is provided a semiconductor device including a semiconductor substrate, a gate electrode formed on the semiconductor substrate, a gate insulating layer sandwiched between the gate electrode and the semiconductor substrate, an interlayer insulating layer formed over the gate electrode and the semiconductor substrate, and a hydroxyl (OH) group trapper formed in the interlayer insulating layer. For instance, the hydroxyl group trapper is constituted of a nitrogen containing oxide layer. The semiconductor device is capable of preventing moisture contained in the interlayer insulating layer from penetrating the gate insulating layer and source/drain regions formed in the semiconductor substrate, resulting in that the semiconductor device can be kept away from being degraded because of hot carriers, even if the gate insulating layer were formed thinner.

14 Claims, 9 Drawing Sheets

MOS SEMICONDUCTOR DEVICE AND METHOD OF FABRICATING THE SAME

This application is a divisional of U.S. patent application Ser. No. 08/943,416, filed Sep. 30, 1997.

BACKGROUND OF THE INVENTION

1. Field of the Invention

The invention relates to a MOS semiconductor device and a method of fabricating the same.

2. Description of the Related Art

With higher integration and smaller size in a MOS semiconductor device, a problem of degradation of a device due to hot carriers has become significant, resulting in reduction in reliability. To solve this problem, there is widely used LDD (Lightly Doped Drain) structure which lightens an electric field formed between a drain diffusion layer and a gate electrode to thereby suppress generation of hot carriers.

A conventional method of fabricating a MOS semiconductor device is explained hereinbelow with reference to FIGS. 1A to 1E.

First, as illustrated in FIG. 1A, a p-type single crystal silicon substrate 1 is thermally oxidized to thereby form a gate oxide layer 2 at a surface of the silicon substrate 1. Then, for the purpose of adjusting a threshold voltage, the silicon substrate 1 is ion-implanted at about 10 to about 30 keV with doses of about $1 \times 10^{11}$ to about $1 \times 10^{13}$ $cm^{-2}$ boron to thereby form a p-type impurity diffusion layer 3 in the silicon substrate 1.

Then, as illustrated in FIG. 1B, a gate electrode 4 is formed on the gate oxide layer 2 by chemical vapor deposition (CVD) and photolithography. The gate electrode 4 is made of polysilicon. As an alternative, the gate electrode 4 may be made of amorphous silicon. Then, the silicon substrate 1 is ion-implanted at about 30 to about 70 keV with doses of about $1 \times 10^{13}$ to about $1 \times 10^{14}$ $cm^{-2}$ phosphorus with the gate electrode 4 being used as a mask, to thereby form n-type impurity diffusion layers 5 in the silicon substrate 1. The thus formed n-type impurity diffusion layers 5 have LDD structure.

Then, as illustrated in FIG. 1C, a silicon dioxide layer (not illustrated) is deposited all over the silicon substrate and the gate electrode 4 by CVD. Then, the silicon dioxide layer is etched back by anisotropic etching. As a result, the silicon dioxide layer remains as a sidewall oxide layer 6 on a sidewall of the gate electrode 4.

Then, the silicon substrate 1 is ion-implanted at about 50 to about 70 keV with doses of about $1 \times 10^{14}$ to about $1 \times 10^{16}$ $cm^{-2}$ arsenic with the gate electrode 4 and the sidewall oxide layer 6 being used as a mask, to thereby form LDD-structured n+type impurity diffusion layers 7 in the silicon substrate 1, followed by annealing for activating the n-type impurity diffusion layers 5 and the n+type impurity diffusion layers 7. The n-type impurity diffusion layers 5 and the n+type impurity diffusion layers 7 act as source/drain regions.

Then, as illustrated in FIG. 1D, an interlayer oxide layer 8 is formed over the sidewall oxide layer 6 and the gate electrode 4 by CVD by a thickness in the range of about 1000 to about 2000 angstroms.

Then, as illustrated in FIG. 1E, there is formed an interlayer insulating layer 9 on the interlayer oxide layer 8 by a thickness in the range of about 5000 to 8000 angstroms, followed by annealing for reflowing. The interlayer insulating layer 9 is made of borophosphosilicate glass. Then, there are formed contact holes 10 at predetermined locations throughout the interlayer insulating layer 9 and the interlayer oxide layer 8. Then, metal wiring layers 11 are formed filling the contact holes 10 therewith. Thus, there is completed a MOS semiconductor substrate.

The LDD-structured MOS semiconductor device illustrated in FIGS. 1A to 1E has a problem that if the gate oxide layer 2 were formed thinner, a device would be degraded by hot carriers with the result of reduction in reliability. This is because moisture or hydroxyl (OH) groups contained in the interlayer insulating layer 9 diffuse into source/drain regions and/or the gate oxide layer 2 through the interlayer oxide layer 8 situated just above the gate electrode 4.

Katsuyuki Machida et al. have suggested "Improvement of Water-related Hot-carrier Reliability by using ECR Plasma-$SiO_2$," in IEEE Transactions on Electron Devices, Vol. 41, No. 5, May 1994, pp. 709–714. According to the study, water-related hot-carrier degradation is reduced by using ECR plasma $SiO_2$ as the water-blocking layer under the water-containing films such as SOG or TEOS-$O_3$. The water-blocking mechanism proposed therein is, based on the reaction between Si—H bonds and $H_2O$ in ECR-$SiO_2$ film.

SUMMARY OF THE INVENTION

It is an object of the present invention to provide a semiconductor device and a method of fabricating the same which are capable of preventing moisture contained in an interlayer insulating layer from penetrating a gate insulating layer and a semiconductor substrate, to thereby keep high reliability.

In one aspect, there is provided a semiconductor device including (a) a semiconductor substrate, (b) a gate electrode formed on the semiconductor substrate, (c) a gate insulating layer sandwiched between the gate electrode and the semiconductor substrate, (d) an interlayer insulating layer formed over the gate electrode and the semiconductor substrate, and (e) a stopper for preventing moisture contained in the interlayer insulating layer from penetrating the gate insulating layer and the semiconductor substrate.

There is further provided a semiconductor device including (a) a semiconductor substrate, (b) a gate electrode formed on the semiconductor substrate, (c) a gate insulating layer sandwiched between the gate electrode and the semiconductor substrate, (d) an interlayer insulating layer formed over the gate electrode and the semiconductor substrate, and (e) a trapper formed in the interlayer insulating layer for trapping moisture therein.

There is still further provided a semiconductor device including (a) a semiconductor substrate, (b) a gate electrode formed on the semiconductor substrate, (c) a gate insulating layer sandwiched between the gate electrode and the semiconductor substrate, (d) an interlayer insulating layer formed over the gate electrode and the semiconductor substrate, and (e) a trapper formed in the interlayer insulating layer for trapping hydroxyl groups therein.

For instance, the trapper is constituted of an oxide layer containing nitrogen therein. It preferable that the oxide layer contains nitrogen by about $10^{17}$ $cm^{-3}$ or greater. The oxide layer may contain nitrogen by about $10^{17}$ $cm^{-3}$ or greater wholly therein, however, it is more preferable that the oxide layer contains nitrogen locally by about $10^{17}$ $cm^{-3}$ or greater.

There is yet further provided a semiconductor device including (a) a semiconductor substrate, (b) a gate electrode formed on the semiconductor substrate, (c) a gate insulating layer sandwiched between the gate electrode and the semiconductor substrate, and (d) a nitrogen containing oxide layer formed over the gate electrode and the semiconductor substrate.

The nitrogen containing oxide layer contains nitrogen preferably in the range of about $10^{17}$ to about $10^{22}$ cm$^{-3}$ both inclusive, more preferably in the range of about $10^{19}$ to about $10^{22}$ cm$^{-3}$ both inclusive.

In another aspect, there is provided a method of fabricating a semiconductor device, including the steps of (a) forming a gate insulating layer on a semiconductor substrate having first conductivity, (b) forming a gate electrode on the gate insulating layer, (c) implanting impurities into the semiconductor substrate with the gate electrode working as a mask, the impurities having second conductivity, (d) forming an interlayer insulating layer over the gate electrode and the semiconductor substrate, and (e) forming a stopper for preventing moisture contained in the interlayer insulating layer from penetrating the gate insulating layer and the semiconductor substrate.

There is further provided a method of fabricating a semiconductor device, including the steps of (a) forming a gate insulating layer on a semiconductor substrate having first conductivity, (b) forming a gate electrode on the gate insulating layer, (c) implanting impurities into the semiconductor substrate with the gate electrode working as a mask, the impurities having second conductivity, (d) forming an interlayer insulating layer over the gate electrode and the semiconductor substrate, and (e) introducing means for trapping moisture therein into the interlayer insulating layer.

There is still further provided a method of fabricating a:semiconductor device, including the steps of (a) forming a gate insulating layer on a semiconductor substrate having first conductivity, (b) forming a gate electrode on the gate insulating layer, (c) implanting impurities into the semiconductor substrate with the gate electrode working as a mask, the impurities having second conductivity, (d) forming an interlayer insulating layer over the gate electrode and the semiconductor substrate, and (e) introducing a stopper for trapping hydroxyl groups therein into the interlayer insulating layer.

For instance, the step (e) may include the step of ion-implanting nitrogen into the interlayer insulating layer, in which case it is preferable that nitrogen is ion-implanted into the interlayer insulating layer in the range of about $10^{15}$ to about $10^{17}$ cm$^{-2}$ both inclusive, and it is also preferable that the nitrogen has a range smaller than a thickness of the interlayer insulating layer in the interlayer insulating layer.

As an alternative, the step (e) may include the step of exposing the interlayer insulating layer to nitrogen plasma atmosphere. The step (e) may include the steps of (e-1) growing a nitrogen containing layer over the interlayer insulating layer by means of a mixture gas containing a nitrogen compound gas, so that nitrogen contained in the nitrogen containing layer is diffused in solid phase into the interlayer insulating layer, and (e-2) removing the nitrogen containing layer.

It is preferable that the nitrogen containing layer is a nitride layer. For instance, the nitrogen compound gas is ammonia gas.

There is yet further provided a method of fabricating a semiconductor device, including the steps of (a) forming a gate insulating layer on a semiconductor substrate having first conductivity, (b) forming a gate electrode on the gate insulating layer, (c) implanting impurities into the semiconductor substrate with the gate electrode working as a mask, the impurities having second conductivity, and (d) forming a nitrogen containing insulating layer over the gate electrode and the semiconductor substrate.

The nitrogen containing insulating layer is formed, for instance, by means of a mixture gas containing a nitrogen compound gas, in which case it is preferable that the nitrogen compound gas is a dinitrogen monoxide gas or an ammonia gas.

The above-mentioned semiconductor device and method of fabricating the same are capable of preventing moisture or hydroxyl groups contained in the interlayer insulating layer from penetrating the gate insulating layer and source/drain regions formed in the semiconductor substrate, resulting in a semiconductor device that avoids being degraded because of hot carriers, even if the gate insulating layer were formed thinner.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A method of fabricating a MOS semiconductor device in accordance with the first embodiment of the present invention is explained hereinbelow with reference to FIGS. 2A and 2B.

Figure 1A:
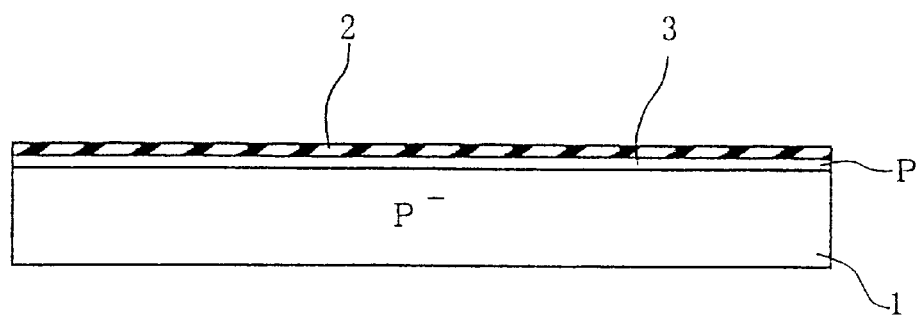
FIGS. 1A to 1E are cross-sectional views of a MOS semiconductor device, illustrating respective steps of a conventional method of fabricating the same.
Figure 1B:
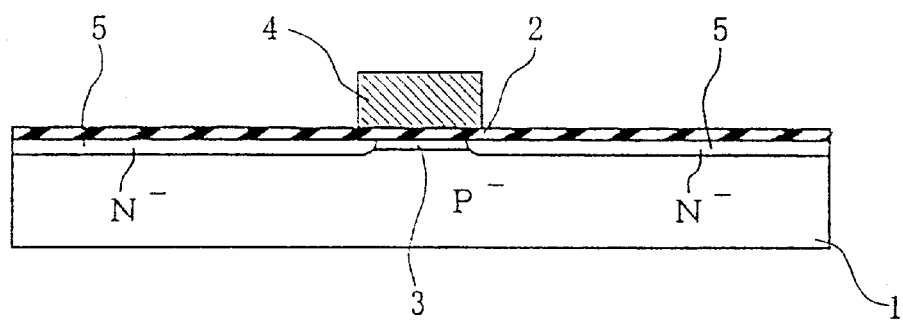
Figure 1C:
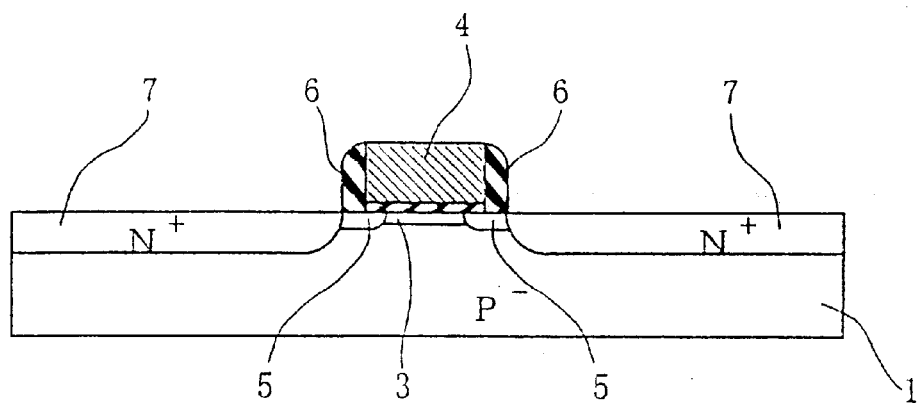
Figure 1D:
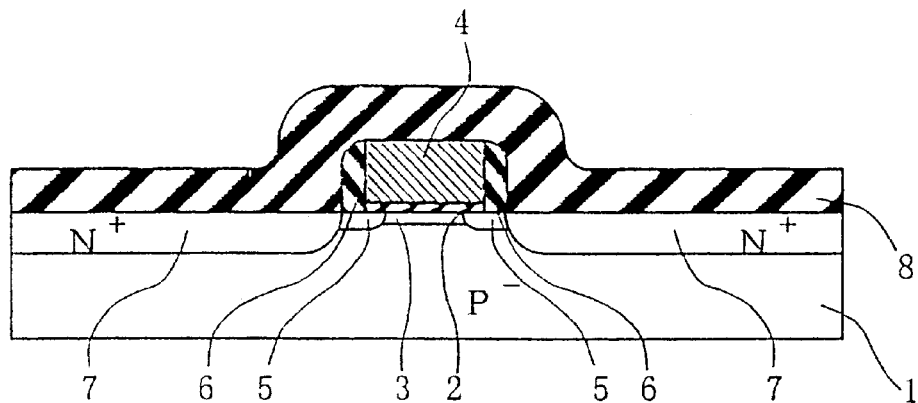

The method in accordance with the first embodiment has the same steps as those having been explained with reference to FIGS. 1A to 1D. Hence, after the interlayer oxide layer 8 has been formed as illustrated in FIG. 1D, the step illustrated in FIG. 2A commences. As illustrated in FIG. 2A, the interlayer oxide layer 8 is ion-implanted at a dose of about $1 \times 10^{15}$ to about $1 \times 10^{17}$ cm$^{-2}$ nitrogen. The energy of nitrogen ions are determined so that the nitrogen has a projection range (Rp) smaller than a thickness of the interlayer oxide layer 8 which is in the range of 1000 to 2000 angstroms in the instant embodiment. For instance the range of nitrogen is determined to be about 500 angstroms.

Figure 2A:
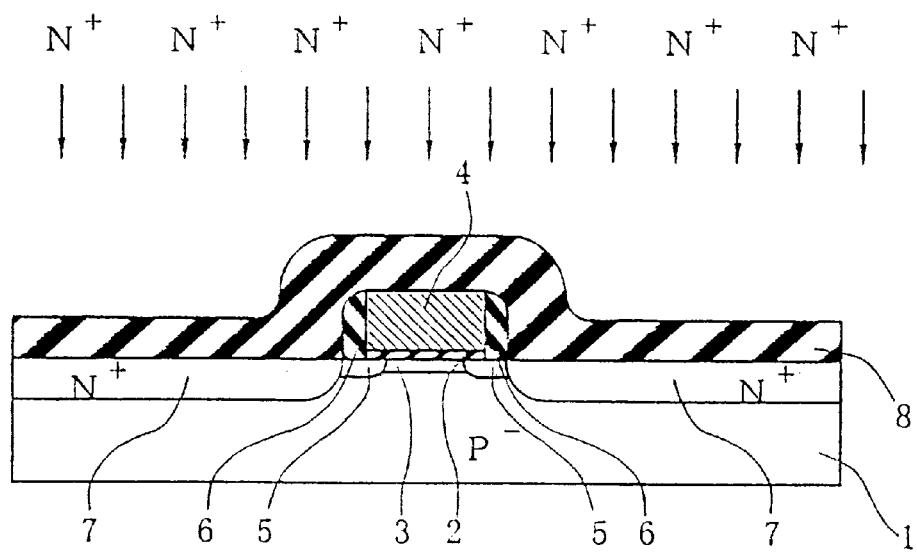
FIGS. 2A and 2B are cross-sectional views of a MOS semiconductor device, illustrating respective steps of a method of fabricating the same in accordance with the first embodiment of the present invention.
Figure 2B:
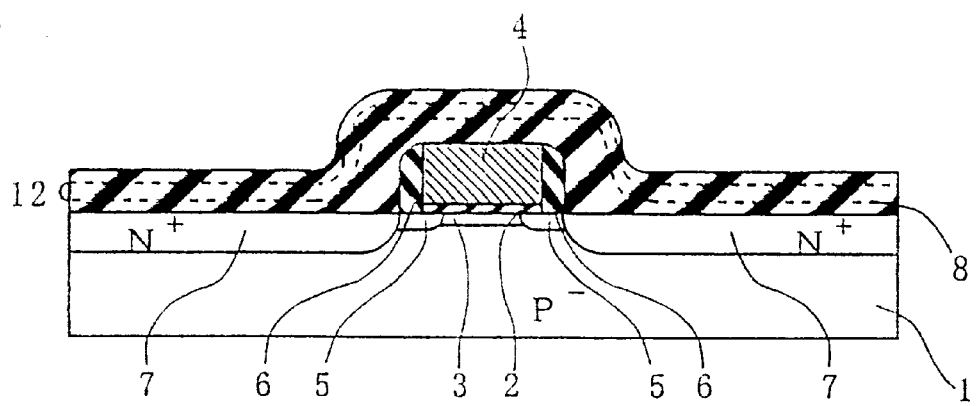

As a result, as illustrated in FIG. 2B, there is formed a nitrogen containing oxide layer 12 (illustrated with a broken line) in the interlayer oxide layer 8.

Figure 1E:
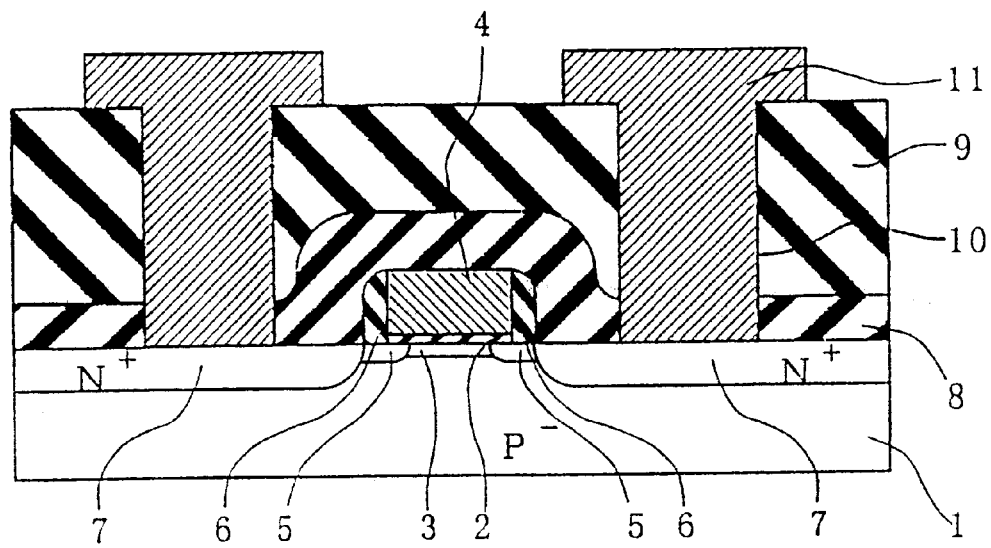

Then, in the same manner as illustrated in FIG. 1E, there are formed the borophosphosilicate glass layer 9, the contact holes 10 and the metal wiring layers 11. Thus, the MOS semiconductor device in accordance with the first embodiment is completed.

The thus formed nitrogen containing oxide layer 12 can trap moisture or hydroxyl (OH) groups contained in the interlayer oxide layer 8. Hence, in accordance with the above-mentioned first embodiment, it is possible to prevent moisture contained in the interlayer oxide layer 8 from penetrating the gate insulating layer 2 and source/drain regions 5, 7 formed in the semiconductor substrate 1.

Figure 3:
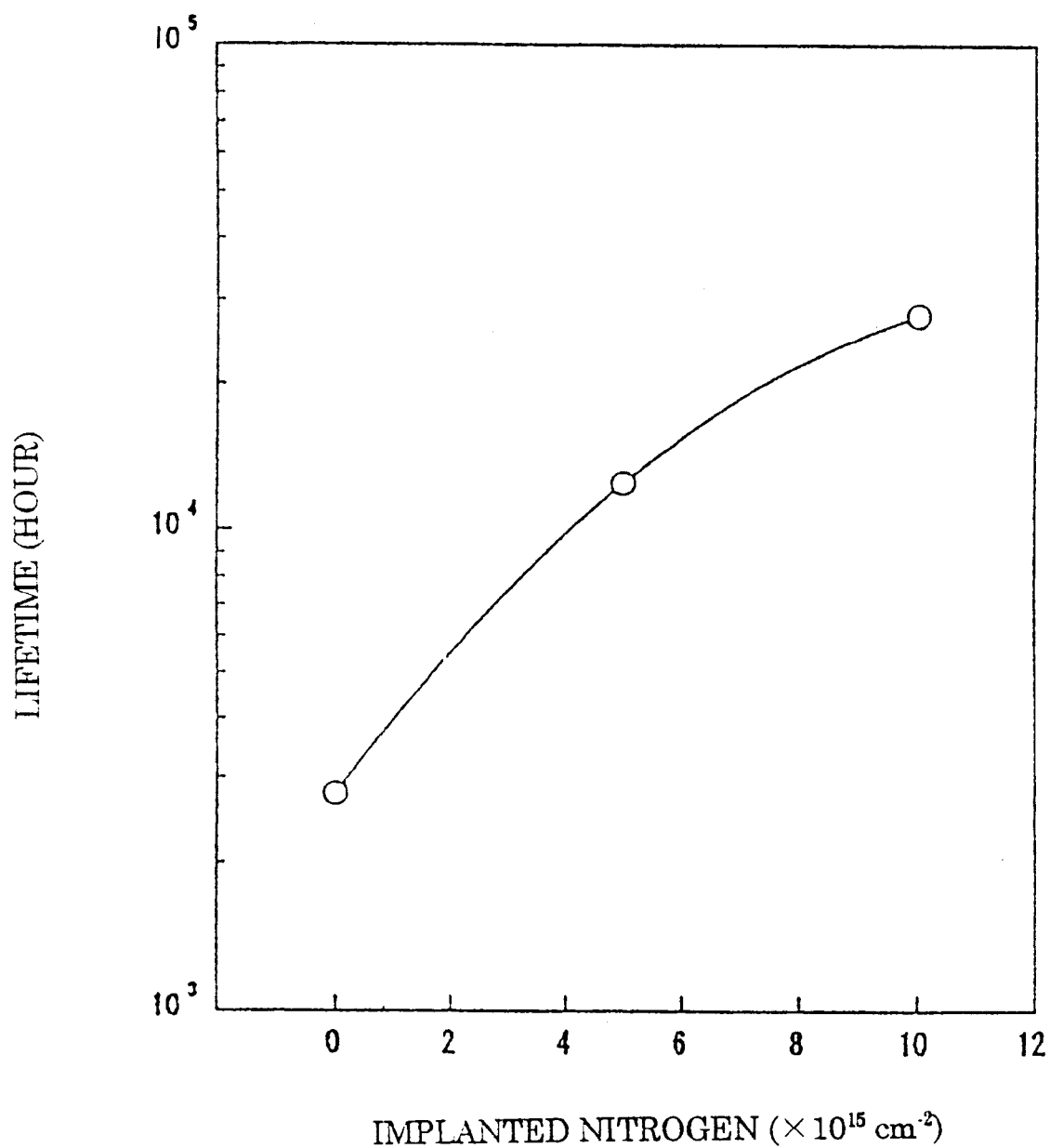
FIG. 3 is a graph showing the relationship between an amount of nitrogen implanted into an interlayer oxide layer and lifetime of the layer.

FIG. 3 is a graph showing the relation between an amount of nitrogen implanted into the interlayer oxide layer 8 illustrated in FIG. 2A and lifetime of the MOS semiconductor device. As is obvious from FIG. 3, the lifetime becomes longer with an increase in an amount of nitrogen implanted into the interlayer Herein, the term "lifetime" means the duration until a current by which a MOS semiconductor device is driven fluctuates by 10%.

Figure 4A:
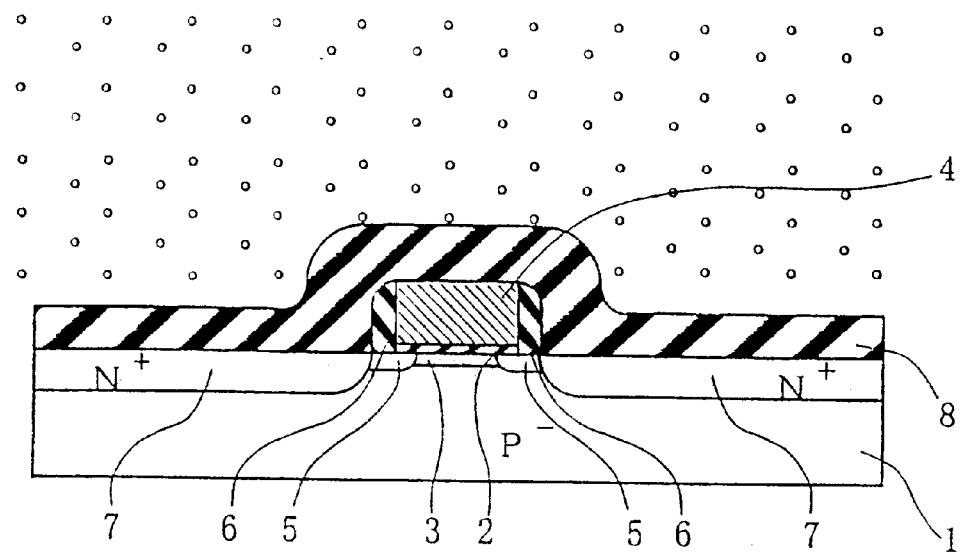
FIGS. 4A and 4B are cross-sectional views of a MOS semiconductor device, illustrating respective steps of a method of fabricating the same in accordance with the second embodiment of the present invention.
Figure 4B:
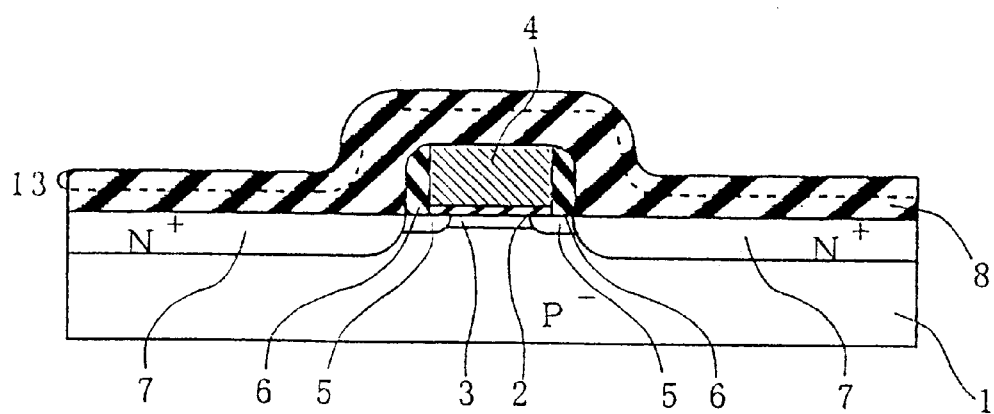

A method of fabricating a MOS semiconductor device in accordance with the second embodiment of the present invention is explained hereinbelow with reference to FIGS. 4A and 4B.

The method in accordance with the second embodiment has the same steps as those having been explained with reference to FIGS. 1A to 1D. Hence, after the interlayer oxide layer 8 has been formed as illustrated in FIG. 1D, the step illustrated in FIG. 4A commences. As illustrated in FIG. 4A, the silicon substrate 1 is exposed to nitrogen plasma atmosphere to thereby introduce nitrogen into the interlayer oxide layer 8 at a surface thereof As a result, as illustrated in FIG. 4B, there is formed a nitrogen containing oxide layer 13 (illustrated with a broken line) in the interlayer oxide layer 8.

Then, in the same manner as illustrated in FIG. 1E, there are formed the borophosphosilicate glass layer 9, the contact holes 10 and the metal wiring layers 11. Thus, the MOS semiconductor device in accordance with the second embodiment is completed.

The thus formed nitrogen containing oxide layer 13 can trap moisture or hydroxyl (OH) groups contained in the interlayer oxide layer 8. Hence, in accordance with the above-mentioned second embodiment, it is possible to prevent moisture contained in the interlayer oxide layer 8 from penetrating the gate insulating layer 2 and source/drain regions 5, 7 formed in the semiconductor substrate 1.

Figure 5A:
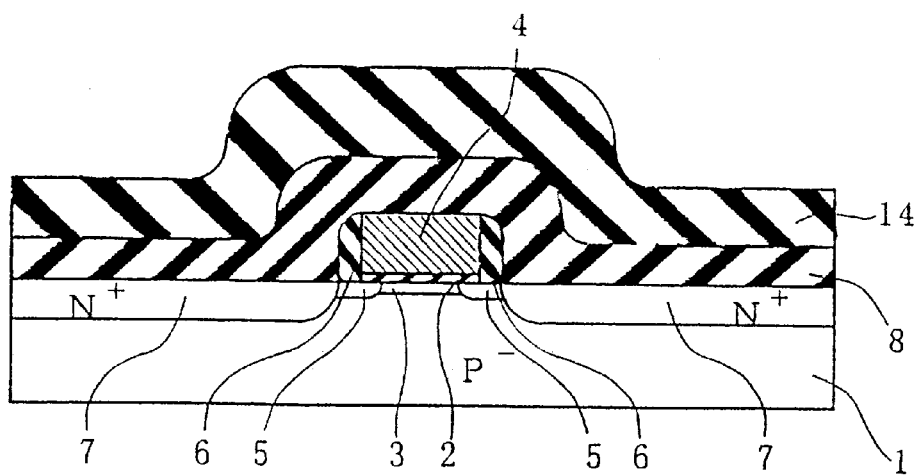
FIGS. 5A and 5B are cross-sectional views of a MOS semiconductor device, illustrating respective steps of a method of fabricating the same in accordance with the third embodiment of the present invention.

A method of fabricating a MOS semiconductor device in accordance with the third embodiment of the present invention is explained hereinbelow with reference to FIGS. 5A and 5B.

The method in accordance with the third embodiment has the same steps as those having been explained with reference to FIGS. 1A to 1D. Hence, after the interlayer oxide layer 8 has been formed as illustrated in FIG. 1D, the step illustrated in FIG. 5A commences. As illustrated in FIG. 5A, a nitride layer 14 is grown over the interlayer oxide layer 8 at about 750° C. by a thickness in the range of about 500 to about 1000 angstroms by means of a mixture gas of ammonia ($NH_3$) and silane ($SiH_4$) gases. While the nitride layer 14 is being grown, nitrogen contained in the nitride layer 14 is diffused in solid phase into the interlayer oxide layer 8.

Figure 5B:
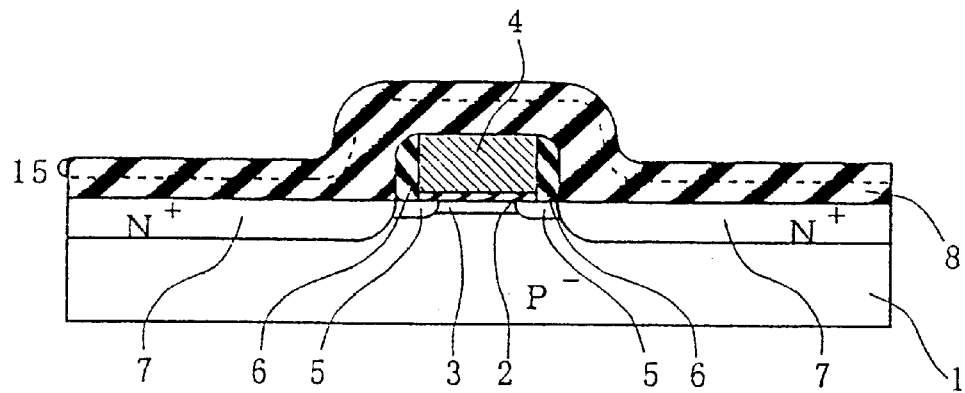

Then, the nitride layer 14 is removed, as illustrated in FIG. 5B. As a result, as illustrated in FIG. 5B with a broken line, there is formed a nitrogen containing oxide layer 15 in the interlayer oxide layer 8.

Then, in the same manner as illustrated in FIG. 1E, there are formed the borophosphosilicate glass layer 9, the contact holes 10 and the metal wiring layers 11. Thus, the MOS semiconductor device in accordance with the third embodiment is completed.

The thus formed nitrogen containing oxide layer 15 traps moisture or hydroxyl (OH) groups contained in the interlayer oxide layer 8. Hence, in accordance with the above-mentioned third embodiment, it is possible to prevent moisture contained in the interlayer oxide layer 8 from penetrating the gate insulating layer 2 and source/drain regions 5, 7 formed in the semiconductor substrate 1.

The nitrogen containing oxide layer 12, 13 and 15 in the first, second and third embodiments may wholly include nitrogen by $10^{17}$ $cm^{-3}$ or greater, however, it is preferable that the nitrogen containing oxide layers 12, 13 and 15 locally include nitrogen by $10^{17}$ $cm^{-3}$ or greater.

Figure 6A:
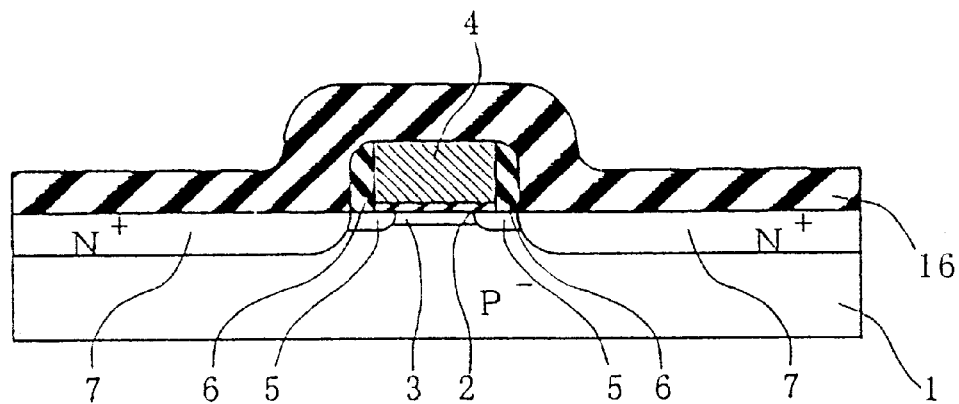
FIGS. 6A and 6B are cross-sectional views of a MOS semiconductor device, illustrating respective steps of a method of fabricating the same in accordance with the fourth embodiment of the present invention.

A method of fabricating a MOS semiconductor device in accordance with the fourth embodiment of the present invention is explained hereinbelow with reference to FIGS. 6A and 6B.

The method in accordance with the fourth embodiment has the same steps as those having been explained with reference to FIGS. 1A to 1C. Hence, after the sidewall oxide layer 6 has been formed as illustrated in FIG. 1C, the step illustrated in FIG. 6A commences. As illustrated in FIG. 6A, there is formed a nitrogen containing oxide layer 16 all over the silicon substrate 1 and the gate electrode 4 by means of a mixture gas of a dinitrogen monoxide gas ($N_2O$), a silane gas ($SiH_4$) and an oxygen gas ($O_2$).

Figure 6B:
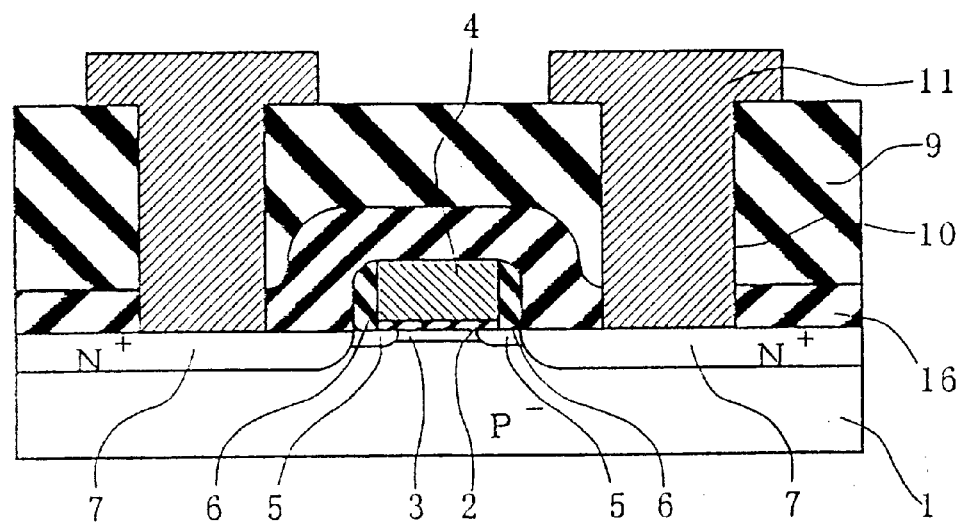

Then, in the same manner as illustrated in FIG. 1E, there are formed the borophosphosilicate glass layer 9, the contact holes 10 and the metal wiring layers 11, as illustrated in FIG. 6B. Thus, the MOS semiconductor device in accordance with the fourth embodiment is completed.

The thus formed nitrogen containing oxide layer 16 can trap moisture or hydroxyl (OH) groups contained therein. Hence, in accordance with the above-mentioned fourth embodiment, it is possible to prevent moisture from penetrating the gate insulating layer 2 and source/drain regions 5, 7 formed in the semiconductor substrate 1.

Figure 7A:
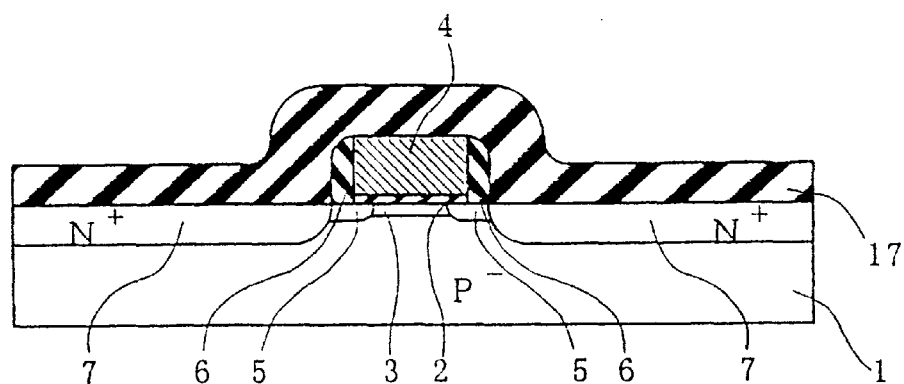
FIGS. 7A and 7B are cross-sectional views of a MOS semiconductor device, illustrating respective steps of a method of fabricating the same in accordance with the fifth embodiment of the present invention.

A method of fabricating a MOS semiconductor device in accordance with the fifth embodiment of the present invention is explained hereinbelow with reference to FIGS. 7A and 7B.

The method in accordance with the fifth embodiment has the same steps as those having been explained with reference to FIGS. 1A to 1C. Hence, after the sidewall oxide layer 6 has been formed as illustrated in FIG. 1C, the step illustrated in FIG. 7A commences. As illustrated in FIG. 7A, there is formed a nitrogen containing oxide layer 17 all over the silicon substrate 1 and the gate electrode 4 by means of a mixture gas of an ammonia gas ($NH_3$), a silane gas ($SiH_4$) and an oxygen gas ($O_2$).

Figure 7B:
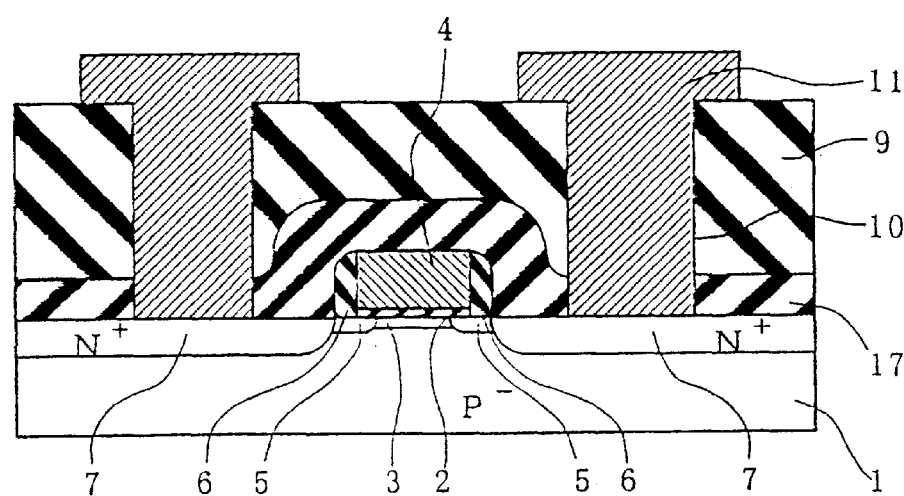

Then, in the same manner as illustrated in FIG. 1E, there are formed the borophosphosilicate glass layer 9, the contact holes 10 and the metal wiring layers 11, as illustrated in FIG. 7B. Thus, the MOS semiconductor device in accordance with the fifth embodiment is completed.

The thus formed nitrogen containing oxide layer 17 can trap moisture or hydroxyl (OH) groups contained therein, similarly to the fourth embodiment. Hence, in accordance with the above-mentioned fifth embodiment, it is possible to prevent moisture from penetrating the gate insulating layer 2 and source/drain regions 5, 7 formed in the semiconductor substrate 1.

In the above-mentioned fourth and fifth embodiments, if a nitride layer would be formed in place of the nitrogen containing oxide layers 16 and 17, it would not be possible to avoid reduction in reliability, because the nitride layer has a different coefficient of thermal expansion from that of the silicon substrate 1.

The mixture gases used for forming the nitrogen containing oxide layers 16 and 17 are designed to have a low concentration of nitrogen gas so that the mixture gases are stoichiometrically not silane ($SiH_4$) gas. For instance, it is preferable that the mixture gases have a nitrogen concentration ranging from about $1 \times 10^{17}$ to about $1 \times 10^{22}$ $cm^{-3}$. It has been confirmed that If the mixture gases have a nitrogen concentration ranging from about $1 \times 10^{19}$ to about $1 \times 10^{22}$ $cm^{-3}$, it would be possible to prevent reduction in reliability of the nitrogen containing oxide layers 16 and 17 and prolong the lifetime of the n-channel MOS semiconductor device.

In the above-mentioned embodiments, the nitrogen containing oxide layers 12, 13, 15, 16 and 17 are exemplified as means for trapping moisture or hydroxyl (OH) groups. However, it should be noted that other moisture or OH group trappers may be employed in place of the nitrogen containing oxide layers.

It also should be noted that the above-mentioned embodiments are applied to an n-channel MOS semiconductor device, however, the present invention may be applied to a p-channel MOS semiconductor device.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-278665 filed on Sep. 30, 1996 including specification, claims, drawings and summary is incorporated herein by reference in its entirety.

What is claimed is:

1. A method of fabricating a semiconductor device, comprising:
   (a) forming a gate insulating layer on a semiconductor substrate having first conductivity;
   (b) forming a gate electrode on said gate insulating layer;
   (c) implanting impurities into said semiconductor substrate with said gate electrode working as a mask, said impurities having second conductivity;
   (d) forming an interlayer insulating layer having substantially no moisture content over said gate electrode and said semiconductor substrate; and
   (e) forming a moisture trapping layer in said interlayer insulating layer for preventing moisture of an overlying layer from penetrating said gate insulating layer and said semiconductor substrate.

2. A method of fabricating a semiconductor device, comprising:
   (a) forming a gate insulating layer on a semiconductor substrate having first conductivity;
   (b) forming a gate electrode on said gate insulating layer;
   (c) implanting impurities into said semiconductor substrate with said gate electrode working as a mask, said impurities having second conductivity;
   (d) forming an interlayer insulating layer having substantially no moisture content over said gate electrode and said semiconductor substrate; and
   (e) introducing a material for trapping moisture into said interlayer insulating layer.

3. A method of fabricating a semiconductor device, comprising:
   (a) forming a gate insulating layer on a semiconductor substrate having first conductivity;
   (b) forming a gate electrode on said gate insulating layer;
   (c) implanting impurities into said semiconductor substrate with said gate electrode working as a mask, said impurities having second conductivity;
   (d) forming an interlayer insulating layer having substantially no hydroxyl content over said gate electrode and said semiconductor substrate; and
   (e) introducing a material for trapping hydroxyl groups into said interlayer insulating layer.

4. The method as set forth in claim 3, wherein said step (e) comprises the step of ion-implanting nitrogen into said interlayer insulating layer.

5. The method as set forth in claim 4, wherein nitrogen is ion-implanted into said interlayer insulating layer in the range of about $10^{15}$ to about $10^{17}$ $cm^{-2}$ both inclusive.

6. The method as set forth in claim 4, wherein said nitrogen has a range smaller than a thickness of said interlayer insulating layer.

7. The method as set forth in claim 3, wherein said step (e) comprises the step of exposing said interlayer insulating layer to nitrogen plasma atmosphere.

8. The method as set forth in claim 3, wherein said step (e) comprises the steps of:
   (e-1) growing a nitrogen containing layer over said interlayer insulating layer by means of a mixture gas containing a nitrogen compound gas, so that nitrogen contained in said nitrogen containing layer is diffused in solid phase into said interlayer insulating layer; and
   (e-2) removing said nitrogen containing layer.

9. The method as set forth in claim 8, wherein said nitrogen containing layer is a nitride layer.

10. The method as set forth in claim 8, wherein said nitrogen compound gas is ammonia gas.

11. A method of fabricating a semiconductor device, comprising:
    (a) forming a gate insulating layer on a semiconductor substrate having first conductivity;
    (b) forming a gate electrode on said gate insulating layer;
    (c) implanting impurities into said semiconductor substrate with said gate electrode working as a mask to form respective source and drain regions, said impurities having second conductivity; and
    (d) introducing nitrogen into an interlayer insulating layer to form a nitrogen containing interlayer insulating layer to completely cover said gate electrode and said source and drain regions of said semiconductor substrate.

12. The method as set forth in claim 11, wherein said nitrogen containing interlayer insulating layer is formed by means of a mixture gas containing a nitrogen compound gas.

13. The method as set forth in claim 12, wherein said nitrogen compound gas is a dinitrogen monoxide gas.

14. The method as set forth in claim 12, wherein said nitrogen compound gas is an ammonia gas.

* * * * *